(12) United States Patent
Chen

(10) Patent No.: US 7,948,036 B2
(45) Date of Patent: May 24, 2011

(54) I/O AND POWER ESD PROTECTION CIRCUITS BY ENHANCING SUBSTRATE-BIAS IN DEEP-SUBMICRON CMOS PROCESS

(75) Inventor: Jau-Wen Chen, Cupertino, CA (US)

(73) Assignee: LSI Corporation, Milpitas, CA (US)

( * ) Notice: Subject to any disclaimer, the term of this patent is extended or adjusted under 35 U.S.C. 154(b) by 0 days.

(21) Appl. No.: 12/506,746

(22) Filed: Jul. 21, 2009

(65) Prior Publication Data

US 2009/0294856 A1 Dec. 3, 2009

Related U.S. Application Data

(60) Division of application No. 11/258,253, filed on Oct. 25, 2005, now Pat. No. 7,582,938, which is a continuation-in-part of application No. 10/676,602, filed on Oct. 1, 2003, now Pat. No. 6,979,869.

(51) Int. Cl.
*H01L 23/62* (2006.01)
(52) U.S. Cl. ........ 257/357; 257/355; 257/356; 257/360; 257/363; 257/E27.06
(58) Field of Classification Search .................. 257/355, 257/356, 357, 360, 361, 362, 363, 371, E27.06
See application file for complete search history.

(56) References Cited

U.S. PATENT DOCUMENTS

| | | | |
|---|---|---|---|
| 4,855,620 A | 8/1989 | Duvvury et al. | |
| 5,401,996 A | 3/1995 | Kelly | |
| 5,623,156 A | 4/1997 | Watt | |
| 5,932,914 A | 8/1999 | Horiguchi | |
| 6,329,694 B1 | 12/2001 | Lee et al. | |
| 6,469,354 B1 | 10/2002 | Hirata | |
| RE38,222 E | 8/2003 | Wu | |
| 6,750,517 B1 | 6/2004 | Ker et al. | |
| 6,788,507 B2 * | 9/2004 | Chen et al. | 361/56 |
| 6,858,902 B1 | 2/2005 | Salling et al. | |
| 7,336,459 B2 * | 2/2008 | Chen | 361/56 |

OTHER PUBLICATIONS

"ESD in Silicon Integrated Circuits"; Design Concepts, Chapter 4, Section 2, p. 69-71, May 15, 2002.
Duvvury, C, "ESD on-chip protection in advanced technologies"; 1999 ESD tutorial, Orlando, Florida, Sep. 26, 1999.
Duvvury, C. et al., "Advanced CMOS Protection Device Trigger Mechanisms During CDM", EOS/ESD Symposium, 1995.

* cited by examiner

*Primary Examiner* — Bradley K Smith
*Assistant Examiner* — Mohammad T Karimy
(74) *Attorney, Agent, or Firm* — Clark Hill PLC

(57) ABSTRACT

A technique to enhancing substrate bias of grounded-gate NMOS fingers (ggNMOSFET's) has been developed. By using this technique, lower triggering voltage of NMOS fingers can be achieved without degrading ESD protection in negative zapping. By introducing a simple gate-coupled effect and a PMOSFET triggering source with this technique, low-voltage triggered NMOS fingers have also been developed in power and I/O ESD protection, respectively. A semiconductor device which includes a P-well which is underneath NMOS fingers. The device includes an N-well ring which is configured so that the inner P-well underneath the NMOS fingers is separated from an outer P-well. The inner P-well and outer P-well are connected by a P-substrate resistance which is much higher than the resistance of the P-wells. A P+-diffusion ring surrounding the N-well ring is configured to connect to VSS, i.e., P-taps.

11 Claims, 9 Drawing Sheets ately, this high impedance region also generates a higher resistance path from VSS P-well taps to drains of ggNMOSFET's, and thus creates a higher voltage drop in ESD negative zapping. Therefore, this approach is to improve ESD protection in positive zapping, but degrade ESD protection in negative zapping. This approach cannot be a universal solution in CMOS technology because, unless an additional P/N junc-

I/O AND POWER ESD PROTECTION CIRCUITS BY ENHANCING SUBSTRATE-BIAS IN DEEP-SUBMICRON CMOS PROCESS

CROSS-REFERENCE

This patent application is a divisional of U.S. patent application Ser. No. 11/258,253, filed on Oct. 25, 2005, which is hereby incorporated herein by reference in its entirety. U.S. patent application Ser. No. 11/258,253 is a continuation-in-part of U.S. patent application Ser. No. 10/676,602 (now U.S. Pat. No. 6,979,869), filed on Oct. 1, 2003, which is hereby incorporated herein by reference in its entirety.

BACKGROUND

The present invention generally relates to ESD (Electro-Static Discharge) protection devices in integrated-circuit chip designs, and more specifically relates to low-voltage trigger NMOS fingers.

Grounded-gate NMOSFET's (ggNMOSFET's) are widely used as the power pin ESD (Electro-Static Discharge) protection device in integrated-circuit chip designs. A cross-sectional diagram of a typical four-finger ggNMOSFET is shown in FIG. 1, wherein reference numerals 10 identify the fingers. The ggNMOSFET is triggered by turning-on parasitic bipolar transistors 24 due to avalanche breakdown with the generation of electron-hole pairs. In FIG. 1, reference numerals 14 identify source connections to VSS 15, reference numerals 16 identify gate connections to VSS 15, reference numerals 17 identify P-well tap connections to VSS 15, reference numerals 19 identify drain connections to I/O or VDD 21, and reference numerals 18 identify shallow trench isolation ("STI") regions.

The P-well 20 is formed on a P-conductivity type substrate 22. To trigger the parasitic bipolar transistors 24, the effective P-Well resistance 26 plays an important role because of building-up the potential at the source to P-Well junction 28. However, the doping concentration of the P-well 20 is usually much higher than that of the resistance of the P-substrate 22, so the effective P-Well resistance 26 is relatively low. Therefore, the traditional ggNMOSFET has a higher trigger voltage. As CMOS technology scales down in the semiconductor industry, gate-oxide thickness decreases (e.g., 20 Angstroms in 0.13 μm node technology), as well as junction depth. Therefore, the ESD protection window is narrowed because the triggering voltage of ggNMOSFET's is very close to the voltage level at which the oxide breaks down. It becomes especially difficult to protect ESD protection devices in power-crossing circuitry, e.g., in digital-to-analog or analog-to-digital interface circuits. To lower the triggering voltage of ggNMOSFET's, U.S. Pat. No. 6,469,354 proposes providing a high impedance region between ggNMOSFET's and VSS P-well taps to trigger the parasitic bipolar transistors below avalanche breakdown due to the high resistance of the P-substrate. This high impedance region can generate a higher substrate resistance so that the base-emitter potential at the P-well to source junction can be easily built up, and thus lower the triggering voltage of ggNMOSFET's. Unfortu- tion diode is provided, ESD protection degrades in the case of negative zapping, due to the high-impedance region. Additionally, triggering voltage cannot be lowered too substantially in the case of high avalanche breakdown junction design.

In C. Duvvury & A. Amerasekera, *Advanced CMOS Protection Device Trigger Mechanisms During CDM*, 1995 EOS/ESD Symposium (EOS-17), pp. 162-174, gate-coupled NMOS fingers were designed to lower the triggering voltage by using an external capacitor and an external resistor. However, this gate-coupled device usually needs a large layout area, and thus is not feasible.

The purpose of the present invention is to lower the triggering voltage of ggNMOSFET's by enhancing substrate bias without degrading ESD protection in negative zapping. With this substrate-biased technique, a gate-coupled effect and a triggering source are also introduced in power and I/O ESD protection, respectively.

OBJECTS AND SUMMARY

An object of an embodiment of the present invention is to provide low-voltage trigger NMOS fingers by introducing both a gate-coupled effect and a high substrate resistance as the ESD power clamp device.

Another object of an embodiment of the present invention is to provide a gate-coupled effect by using only a simple N-Well resistor, and using a high substrate resistance to enhance the trigger when the gate is coupled.

Still another object of an embodiment of the present invention is to lower the triggering voltage without degrading ESD protection in negative zapping direction.

Still yet another object of an embodiment of the present invention is to provide an ESD protection device which is configured such that avalanche breakdown is not the main trigger mechanism.

Briefly, and in accordance with at least one of the foregoing objects, an embodiment of the present invention provides a semiconductor device which includes a P-well which is underneath NMOS fingers. The device includes an N-well ring which is configured so that the inner P-well underneath the NMOS fingers is separated from an outer P-well. The inner P-well and outer P-well are connected by a P-substrate resistance which is much higher than the resistance of the P-wells. A P+-diffusion ring surrounding the N-well ring is configured to connect to VSS, i.e., P-taps.

BRIEF DESCRIPTION OF THE DRAWINGS

The organization and manner of the structure and operation of the invention, together with further objects and advantages thereof, may best be understood by reference to the following description, taken in connection with the accompanying drawing, wherein.

DESCRIPTION

Figure 1:
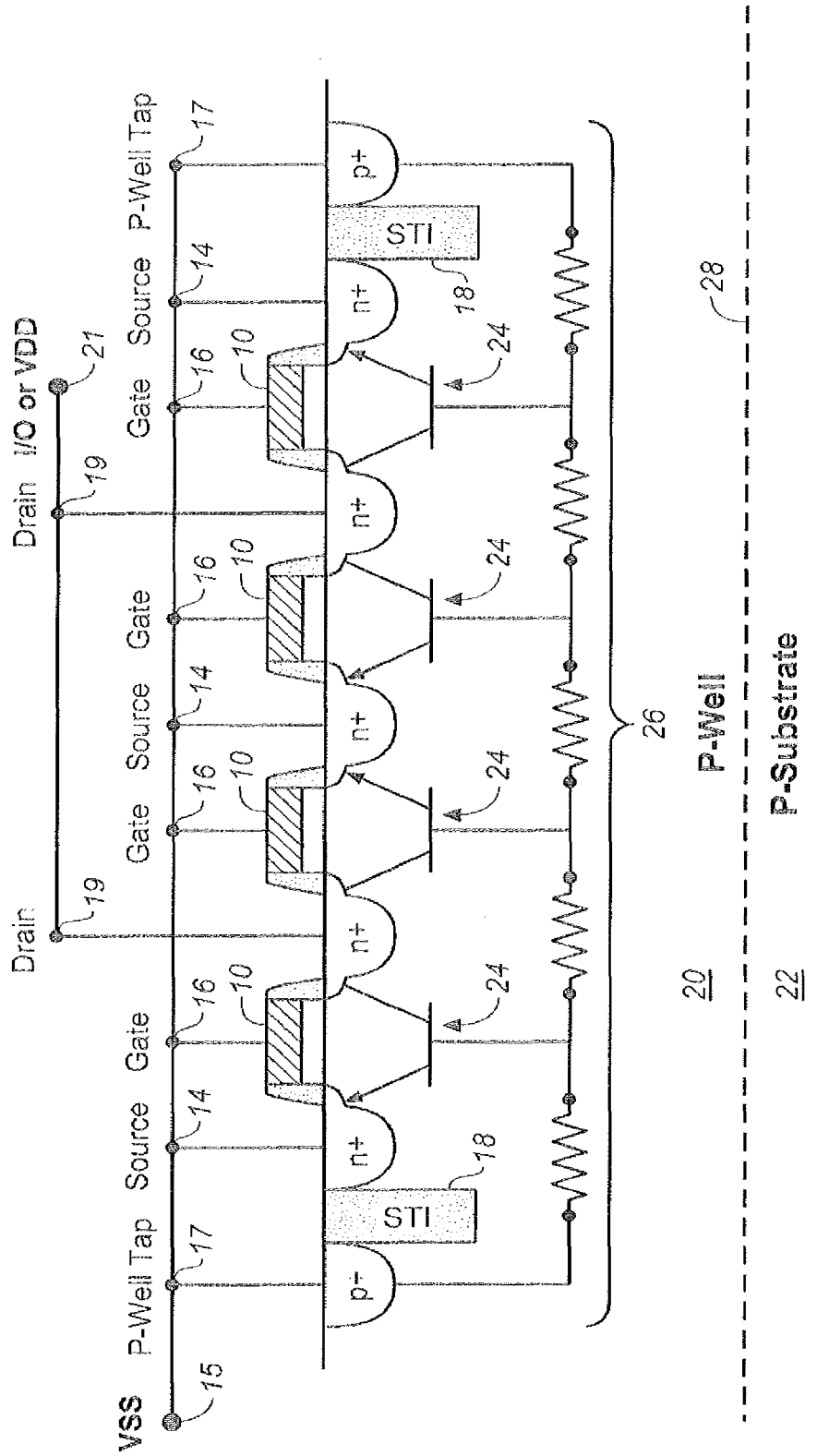
FIG. 1 provides a cross-sectional diagram of a typical four-finger ggNMOSFET.

While the invention may be susceptible to embodiment in different forms, there are shown in the drawings, and herein will be described in detail, specific embodiments with the understanding that the present disclosure is to be considered an exemplification of the principles of the invention, and is not intended to limit the invention to that as illustrated and described herein.

Substrate-Biased Enhancement

Figure 2:
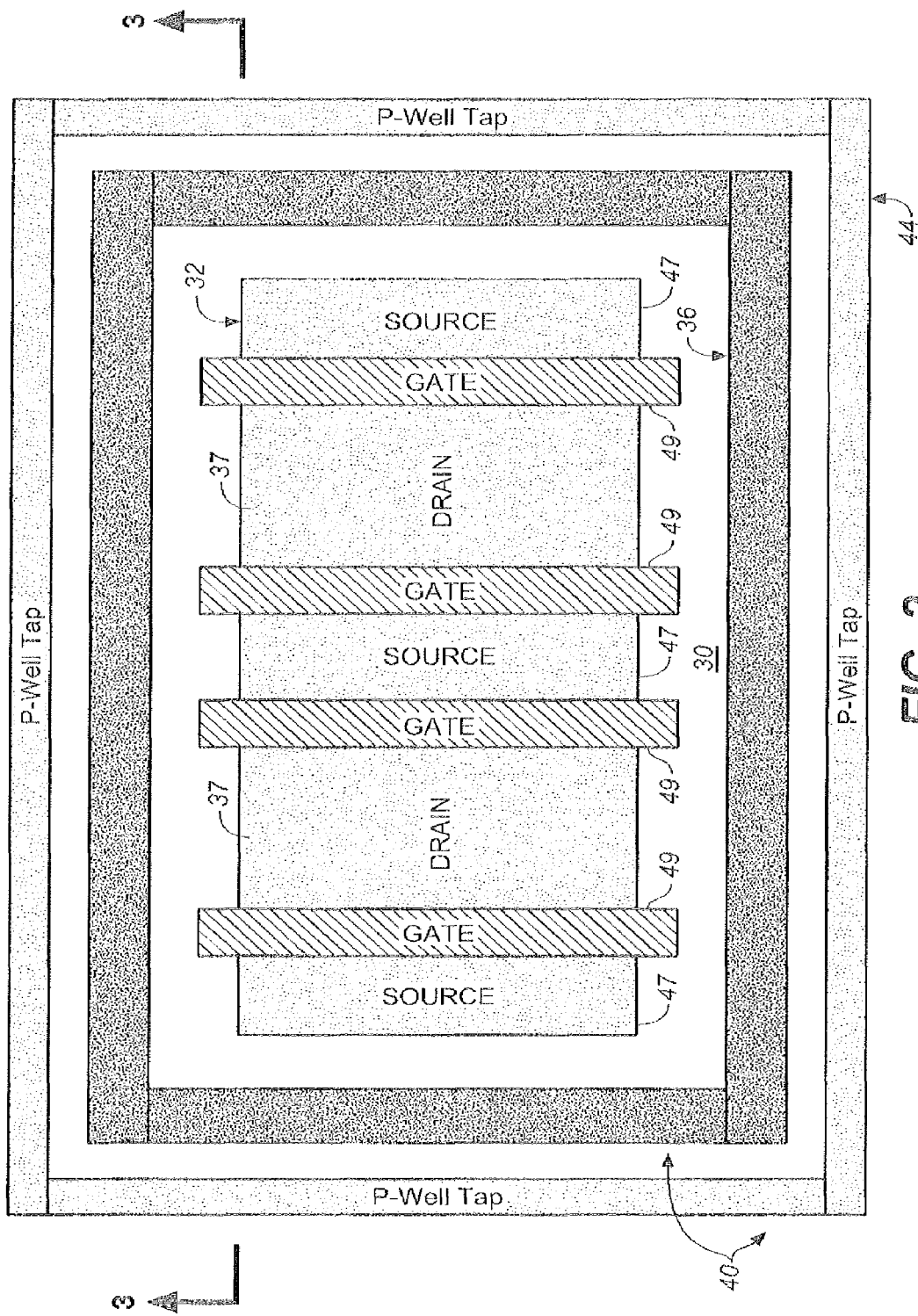
FIG. 2 provides a top view of an nMOSFET design layout for power ESD protection which is in accordance with an embodiment of the present invention.
Figure 3:
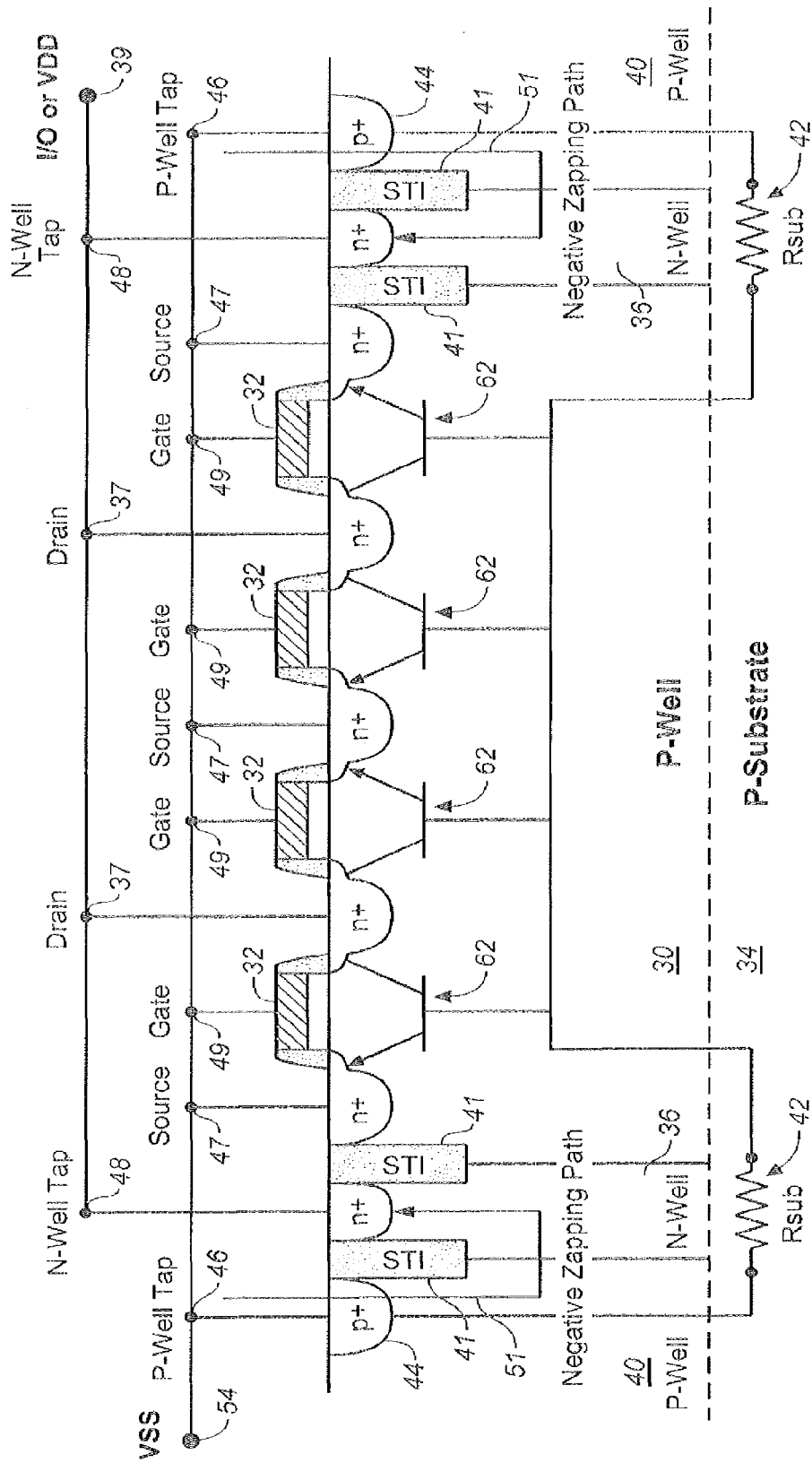
FIG. 3 provides a side, cross-sectional view of the design shown in FIG. 2, taken along line 3-3 of FIG. 2.

FIGS. 2 and 3 show top-view and a cross-sectional diagrams, respectively, for the substrate-biased approach in this invention. In FIGS. 2 and 3, unsilicided NMOS fingers 32 are used for the ESD protection device. A P-well 30 is underneath NMOS fingers 32 and is formed on a P-conductivity type substrate 34. The P-well 30 is surrounded by an N-well ring (VDD) 36. The N-well ring 36 is designed so that the inner P-well 30 underneath the NMOS fingers 32 is separated from the outer P-well 40. More specifically, the N-well ring 36 isolates the first P-well 30 (which is under the NMOS) and the second P-well 40 (which is electrically connected to VSS, i.e., shorted to VSS by using metal (P-taps). The inner P-well 30 and outer P-well 40 are connected by a P-substrate resistance 42 which is much higher than the resistance of the P-wells 30, 40. A P+-diffusion ring 44 surrounding the N-well ring 36 is configured to connect to VSS, i.e., P-taps. In FIG. 3, reference numerals 46 identify P-well taps connected to VSS 54, reference numerals 47 identify source connects to VSS 54, reference numerals 49 identify gate connects to VSS 54, and reference numerals 48 identify N-well taps to I/O or VDD 39. The NMOS fingers 32 are surrounded by a N-well ring 36 so that the inner P-well 30 underneath the NMOS fingers 32 is separated from the outer P-well 40. The inner and outer P-wells are connected through P-substrate resistance 42 which is much higher than P-well resistance. A P+-diffusion ring 44 surrounding this N-well ring 36 is designed to connect to VSS, i.e., P-well taps 46. Because the inner P-well 32 is not hard wired to VSS but shorted to VSS through the P-substrate 34, it can be treated as a "pseudo" floating P-well. In the present invention, both the N-well ring 36 and the drains 37 of the NMOS fingers are always connected electrically to I/O pad or VDD pad 39, as shown in FIG. 3.

In the positive ESD zapping, I/O pad (or VDD pad) voltage is induced and thus a reverse junction current will flow from the I/O pad (or VDD pad) to VSS through the inner P-well 30, the P-substrate 34 and the outer P-well 40. As impact ionization takes place in the drain junction due to higher pad voltage, the current increases because electron-hole pairs are generated. Due to this hole current, the forward bias at the source junction (i.e., base-emitter junction of parasitic bipolar transistors) increases, and finally turns on the parasitic bipolar transistors. As the parasitic bipolar transistors are turned on, the pad voltage is called the triggering voltage.

Because the substrate resistance is much higher than the P-well resistance, the triggering voltage can be lower than the traditional NMOS fingers as shown in FIG. 1. Furthermore, as the pad voltage increases, the N-well ring 36 is reverse-biased so that the N-well to P-substrate junction is fully depleted. This fully depleted region will suppress the current into the deeper P-substrate and results in higher P-substrate resistance. This depleted region is deeper than the depletion due to built-in potential at this junction. Therefore, the triggering voltage of NMOS fingers is even lower than the approach proposed by U.S. Pat. No. 6,469,354.

In the negative ESD zapping, because the N-well 36 is deeper than STI (Shallow-Trench Isolation) 41 in CMOS process, the ESD current can flow from the P-well taps 46 to the I/O pad (or VDD pad) 39 through the outer P-well/N-well junction diode. In FIG. 3, the lines identified by reference numeral 51 indicate the current flow direction during negative zapping.

Therefore, unlike U.S. Pat. No. 6,469,354, this N-well ring 36 not only provides the substrate-biased enhancement for NMOS fingers in positive ESD stress, but also provides an ESD current path in negative ESD stress.

In Latch-Up overshoot and undershoot events, holes and electrons will be injected into P-well 30 and P-substrate 34, respectively. Both N-well 36 and P-well 44 guard rings surrounding the NMOS fingers in this invention have the ability to capture these electrons and holes. This avoids enabling the NMOS fingers 32 in Latch-Up events. Therefore, the NMOS fingers 32 in this invention are immune to Latch-Up overshoot and undershoot events.

In summary, there are at least three advantages of the present invention over the traditional NMOS fingers and the approach proposed by, for example, U.S. Pat. No. 6,469,354:

1. An N-well ring 36 connected to drains 37 of NMOS fingers 32 enhances substrate bias underneath NMOS fingers, and thus lowers the triggering voltage of the NMOS fingers. In 90 nm technology, it was found that the triggering voltage is at least 1V lower than that of the traditional NMOS fingers.
2. An N-well ring 36 connected to drains 37 of NMOS fingers provides a reverse junction diode for ESD current in negative stress. This junction diode avoids the ESD current flowing into the high-resistance P-substrate region 34.
3. Latch-Up immunity can be achieved by using this invention.

Figure 4:
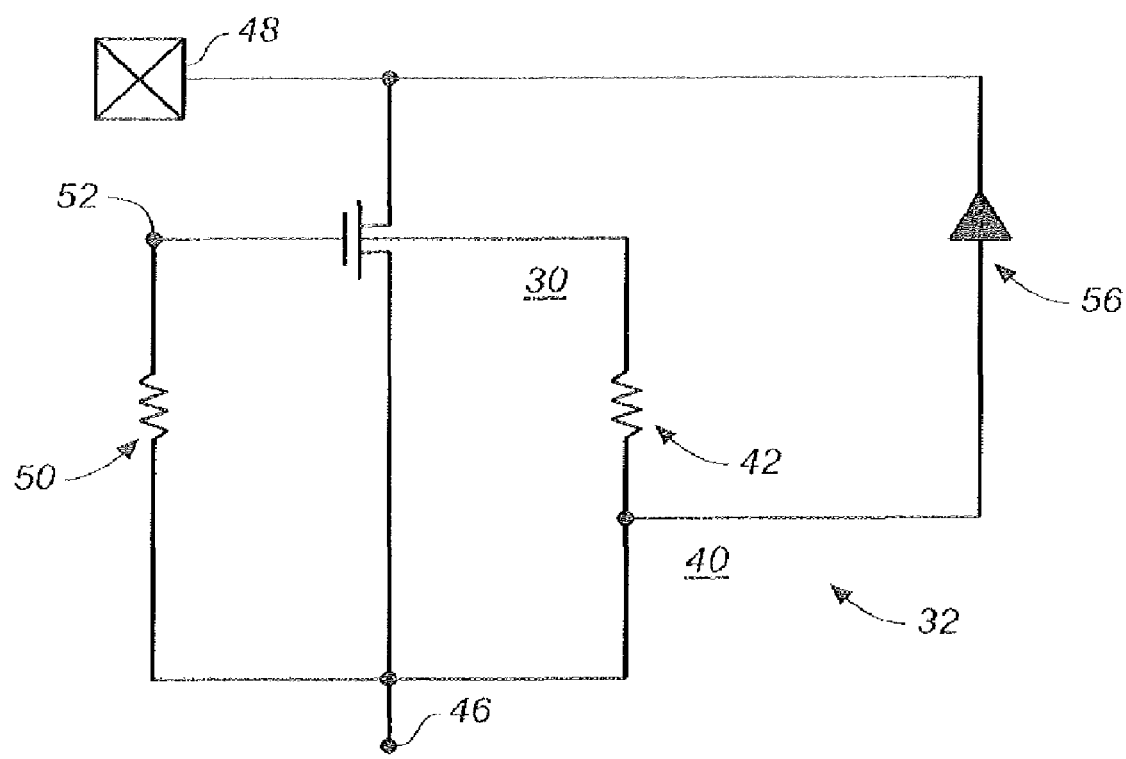
FIG. 4 provides an exemplary schematic circuit diagram of one of the NMOS fingers shown in FIGS. 2 and 3.
Figure 5:
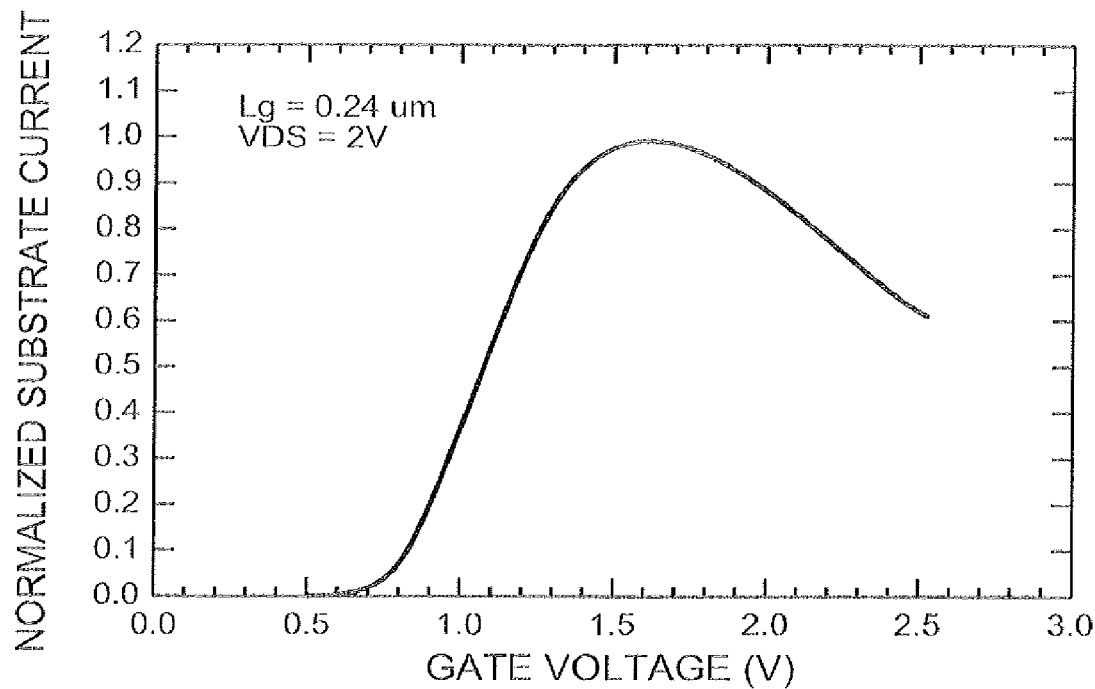
FIG. 5 is a graph which shows gate-voltage dependance of normalized substrate current in 0.13 μm node technology.

A schematic circuit diagram of one of the NMOS fingers 32 is shown in FIG. 4. As shown, a high-value N-well resistor 50 is disposed between the gates 52 and VSS 46. Reference numeral 30 in FIG. 4 identifies the P-well which is underneath the NMOS fingers 32, reference numeral 40 identifies the outer P-well, reference numeral 42 identifies the substrate resistance and reference numeral 56 identifies a N-well diode. In the positive ESD zapping, VDD pad voltage is increased. The gate nodes act as a high-pass filter because of drain-to-gate capacitance and the external N-well resistance, and thus will be coupled. After the gate is coupled, the substrate current of the NMOS fingers 32 increases. FIG. 5 shows the normalized DC substrate current in 0.13 μm node technology. In FIG. 5, gate voltage is provided along the horizontal axis, and the normalized substrate current is provided along the vertical axis (Lg=0.24 μm, VDS=2 volts). Since the NMOS P-well 30 is separated by the N-well ring 36, the substrate current flows into the high-resistance P-substrate 34. Furthermore, because the N-well ring 36 is connected to VDD, it suppresses (as identified by line 58 and arcs 60 in FIG. 6) the substrate current flowing to the VSS P-taps (i.e., the outer P-well 40) due to extension of P-substrate depiction, i.e., increasing the effective substrate resistance 42. Thus, the NMOS P-well voltage is built-up, and triggers the parasitic bipolar transistors 62 (see FIG. 3) at low voltage.

Since the gate-coupled effect strongly depends on drain-to-gate capacitance and external N-well resistance, the value of the N-well resistor 50 must be well optimized. Preferably, the value of the resistor 50 is provided at between 15 kiloOhm-20 kiloOhm for 300 μm-500 μm NMOS fingers, and lowers the trigger voltage of the NMOS in a positive ESD stress condition.

In the negative ESD zapping, since the N-well 36 is deeper than STI (Shallow-Trench Isolation) 41, the ESD current can flow from P-taps 46 (i.e., VSS) to VDD pad using the P-Well/N-Well junction diode (identified with reference numeral 56 in FIG. 4). Therefore, the N-well ring 36 also provides a negative ESD path to avoid the ESD current flowing through the high-resistance P-substrate region (also see FIG. 6).

By introducing both gate-couple and high-resistance substrate effects, the NMOS fingers 32 have very low trigger voltages. To minimize the layout area, the gate-couple effect is achieved by using a simple N-well resistor 50 with high resistance. The N-well ring 36 is configured to separate the inner P-Well 30 and the outer P-Well 40, where the inner P-well 30 is the P-well underneath the NMOS fingers 32 and the outer P-well 40 is the P-well connected to VSS. Because the N-well ring 36 is connected to VDD pad, the N-well ring 36 suppresses the injected current flowing into the outer P-well 40 by increasing the depletion depth in the P-substrate region (see FIG. 6). The N-well ring 36 also provides a low-impedance ESD path in the negative ESD zapping from the outer P-well 40 to this N-well ring 36.

I/O ESD Protection Circuit

Figure 6:
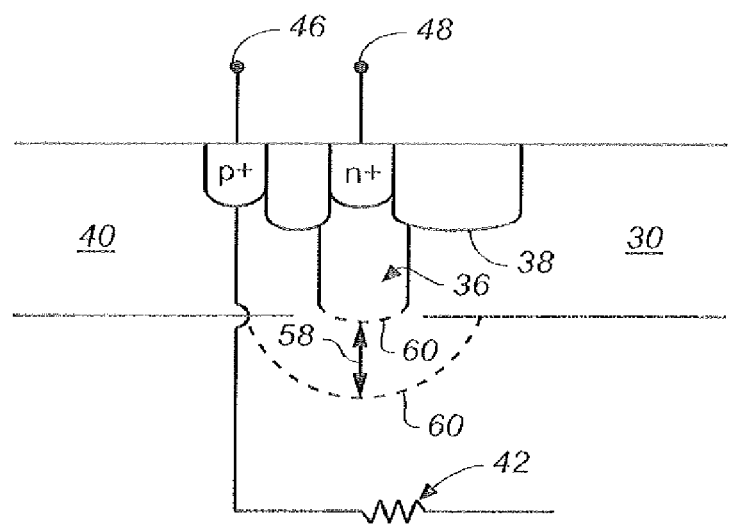
FIG. 6 shows a biased N-well ring to separate P-well regions, which suppresses the substrate current flowing into the VSS P-taps.
Figure 7:
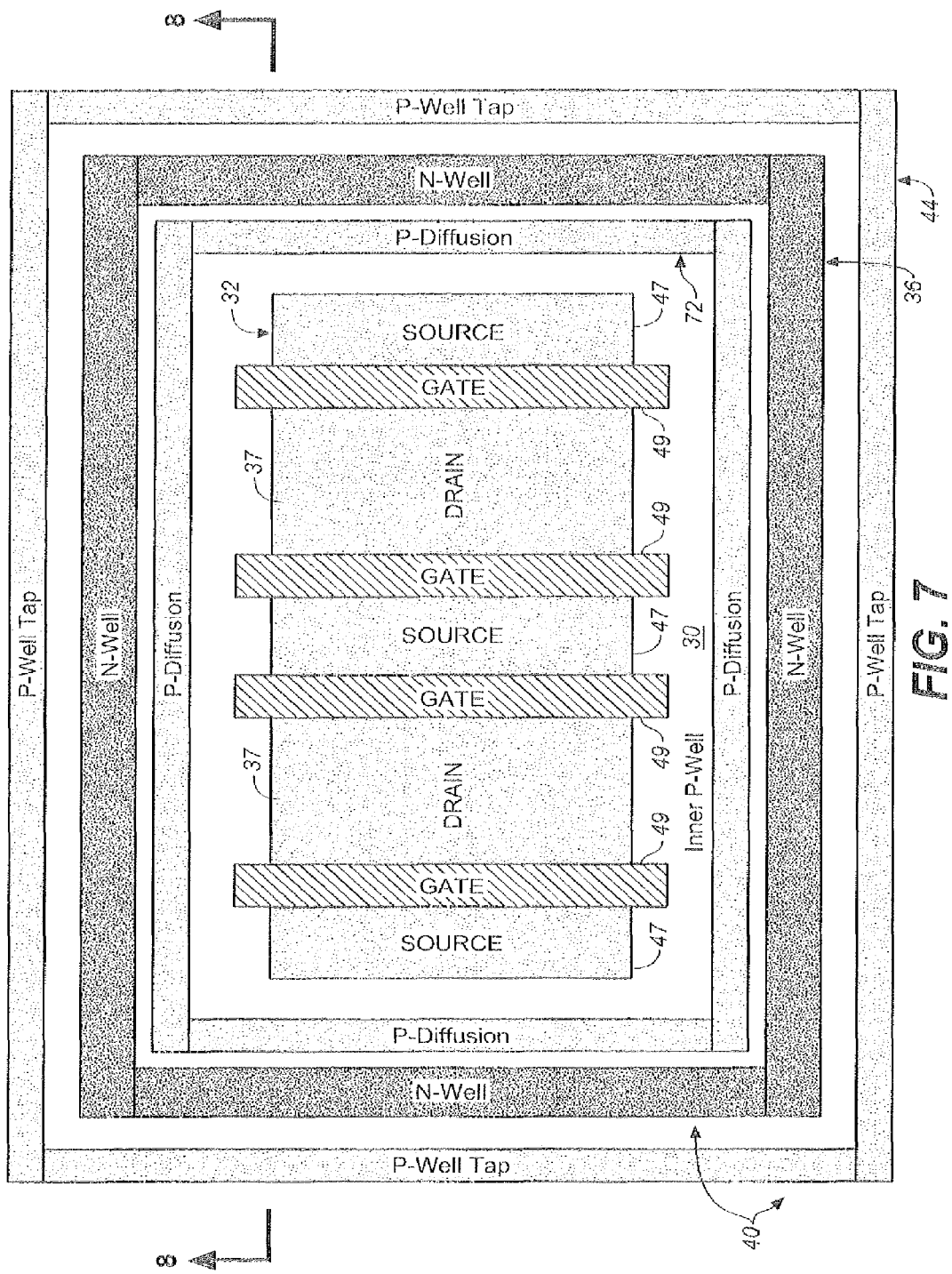
FIGS. 7-10 are similar to FIGS. 2, 3, 4 and 6, but relate to an nMOSFET design layout for I/O ESD protection which is in accordance with another embodiment of the present invention.
Figure 8:
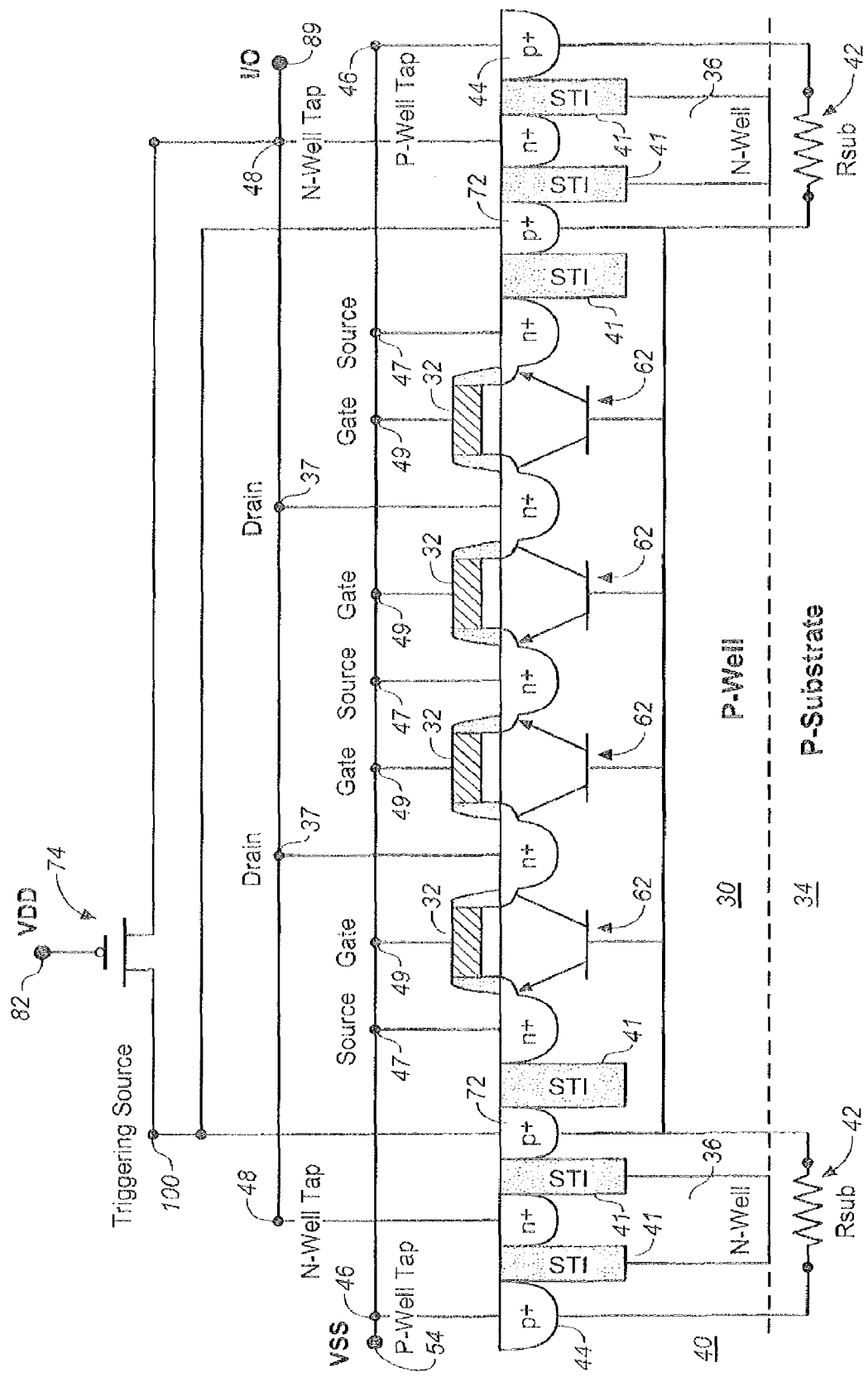
Figure 9:
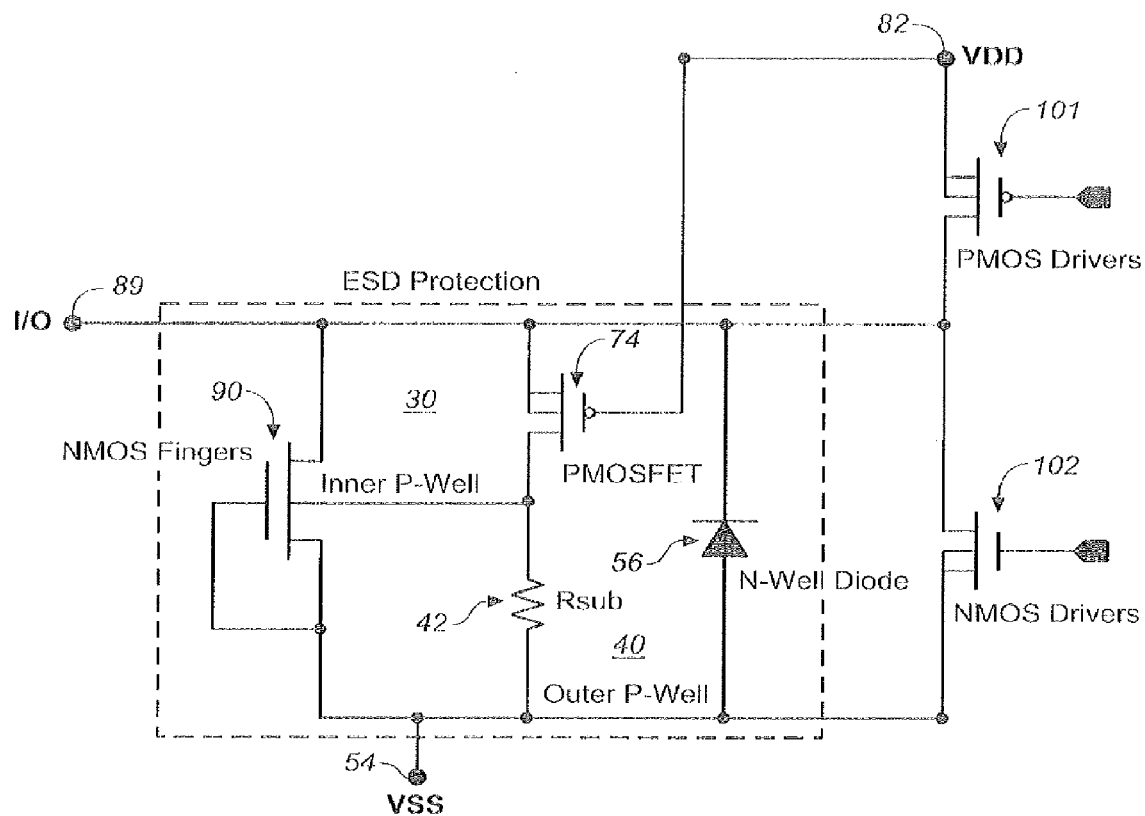

FIGS. 7-10 are similar to FIGS. 2, 3, 4 and 6, respectively, so like reference numerals are used to represent like parts and a detailed description is omitted. However, the differences between the Figures will become apparent from the following description. FIGS. 7 and 8 provide a top-view and a cross-sectional view, respectively, of an nMOSFET design layout which is in accordance with another embodiment of the present invention. In FIGS. 7 and 8, a P-well 30 is underneath grounded-gate NMOS fingers 32 and is surrounded by one P+ diffusion ring 72 which is not hard wired to VSS but is connected to one small-size pMOSFET 74 as the trigger node. An N-well ring 36 surrounds this triggering P+-diffusion ring 72 so that the inner P-well 30 underneath the ggNMOSFET's is separated from the outer P-well 40. The inner P-well 30 and outer P-well 40 are connected by P-substrate resistance 42 which is much higher than the resistance of the P-wells. Finally, a P+-diffusion ring 44 surrounds the N-well 36 and ties to VSS, i.e., P-taps. For small-size pMOSFET's, preferably a long channel length is used (i.e., greater than or equal to 0.5 μm, and its drain and N-well is tied to I/O pads 89, its source is connected to the triggering P+-diffusion, and its gate is connected to VDDIO. A schematic circuit diagram of one of the NMOS fingers is shown in FIG. 9.

In the positive ESD zapping, I/O pad voltage is increased. The gate voltage of PMOSFET's is either the same as VSSIO for the fail-safe case, or lower than I/O pad voltage at least one P/N diode voltage drop for the PMOS driver which N-well is connected to VDDIO. Thus, the PMOSFET is turned on and injects current into the triggering P+-diffusion node. When the injected current is very small, it will just flow to P-taps (i.e., VSSIO) through the P-substrate region underneath the N-well, and thus builds up voltage at the triggering P+-diffusion node. Because of high substrate resistance, the voltage drop at this node increases very easily. When the injected current becomes sufficiently high so that the voltage drop between the triggering P+-diffusion node and VSSIO is higher than the turn-on voltage of the forward junction diode (~0.7 V), the injected current begins to flow into the sources of ggNMOSFET's as base current of the bipolar transistors 62. Hence, the ggNMOSFET's are triggered. Besides the injected current, the drains of ggNMOSFET's contribute a small amount of hole current due to weak impact ionization.

Figure 10:
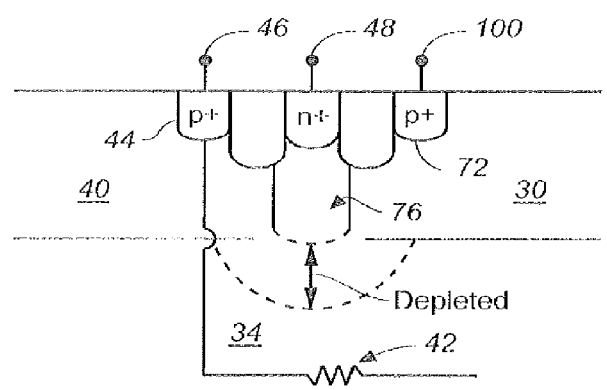

For the N-Well ring, because it is connected to I/O pad, the depletion region in the P-substrate will extend deeper when the I/O pad voltage increases. As shown in FIG. 10, the extended depletion region results in the injected current flowing deeper in the P-substrate region 34, and thus increases the effective substrate resistance. Therefore, in the positive ESD zapping, the N-Well ring plays a role in suppressing the injected current flowing into P-taps (i.e., VSSIO), and thus enhances the current flowing to the sources of ggNMOSFET's (see FIG. 10, noting that node 100 is identified in both FIGS. 8 and 10).

In the negative ESD zapping, since the N-well 36 is deeper than STI (Shallow-Trench Isolation) 41, the ESD current can flow from P-taps (i.e., VSSIO) to I/O pad using the P-Well/N-Well junction diode. Therefore, the N-Well ring 36 also provides a negative ESD path to avoid the ESD current flowing through the high-resistance P-substrate region 34.

A small-size and long channel-length PMOSFET is designed to inject the triggering current. Thus, the ggNMOSFET's (ESD device) (see reference numeral 90 in FIG. 9) are triggered mainly due to the injected current, not the avalanche breakdown mechanism. The size and channel length of PMOSFET is suggested to be around 20 μm and 0.5 μm, respectively. The N-well ring 36 is configured to separate the inner P-well 30 and the outer P-well 40, where the inner P-well 30 is the P-well underneath the ggNMOSFET's and the outer P-well 40 is the P-Well connected to VSSIO. Because the N-well ring 36 is connected to I/O pad 89, the N-well ring 36 suppresses the injected current flowing into the outer P-well 40 by increasing the depiction depth in the P-substrate region 34 (see FIG. 10).

The N-well ring 36 also provides a low-impedance ESD path in the negative ESD zapping from the outer P-well 40 to this N-well ring 36. The triggering P+-diffusion ring sinks the injection current from the PMOSFET. Preferably, the ring is as narrow as possible.

The schematic circuit including PMOS and NMOS drivers 101, 102 is shown in FIG. 9.

In the positive ESD zapping, I/O pad voltage is increased. The gate voltage of PMOSFET's is lower than I/O pad voltage at least one P/N diode voltage drop for the PMOS drivers which N-well is connected to VDD. Thus, the PMOSFET 74 is turned on and injects current into the triggering P-diffusion node within the inner P-well 30. As the injected current is very small, it will just flow into P-well taps 46 within the outer P-well 40 through the P-substrate region 34 underneath the N-well 36, and thus builds up voltage at the triggering P-diffusion node. Because of high substrate resistance 42, the voltage drop at this node will be built-up very easily. As the injected current becomes sufficiently high so that the voltage drop between the triggering P-diffusion node and VSS is higher than turn-on voltage of forward junction diode (~0.7V), the injected current begins flowing into the sources of NMOS fingers as the base current of bipolar transistors. Hence, the NMOS fingers are triggered. Therefore, the PMOSFET as a triggering source as shown in FIGS. 8 and 9 improves the positive ESD stress in this inventive design.

Gate-Coupled Effect for Power ESD Protection

In the power ESD protection, the substrate-biased enhancement can be further improved by introducing the gate-coupled effect. A well-known gate-coupled NMOS fingers were designed to lower the triggering voltage by using an external capacitor and an external resistor [A. Amerasekera &

Figure 11:
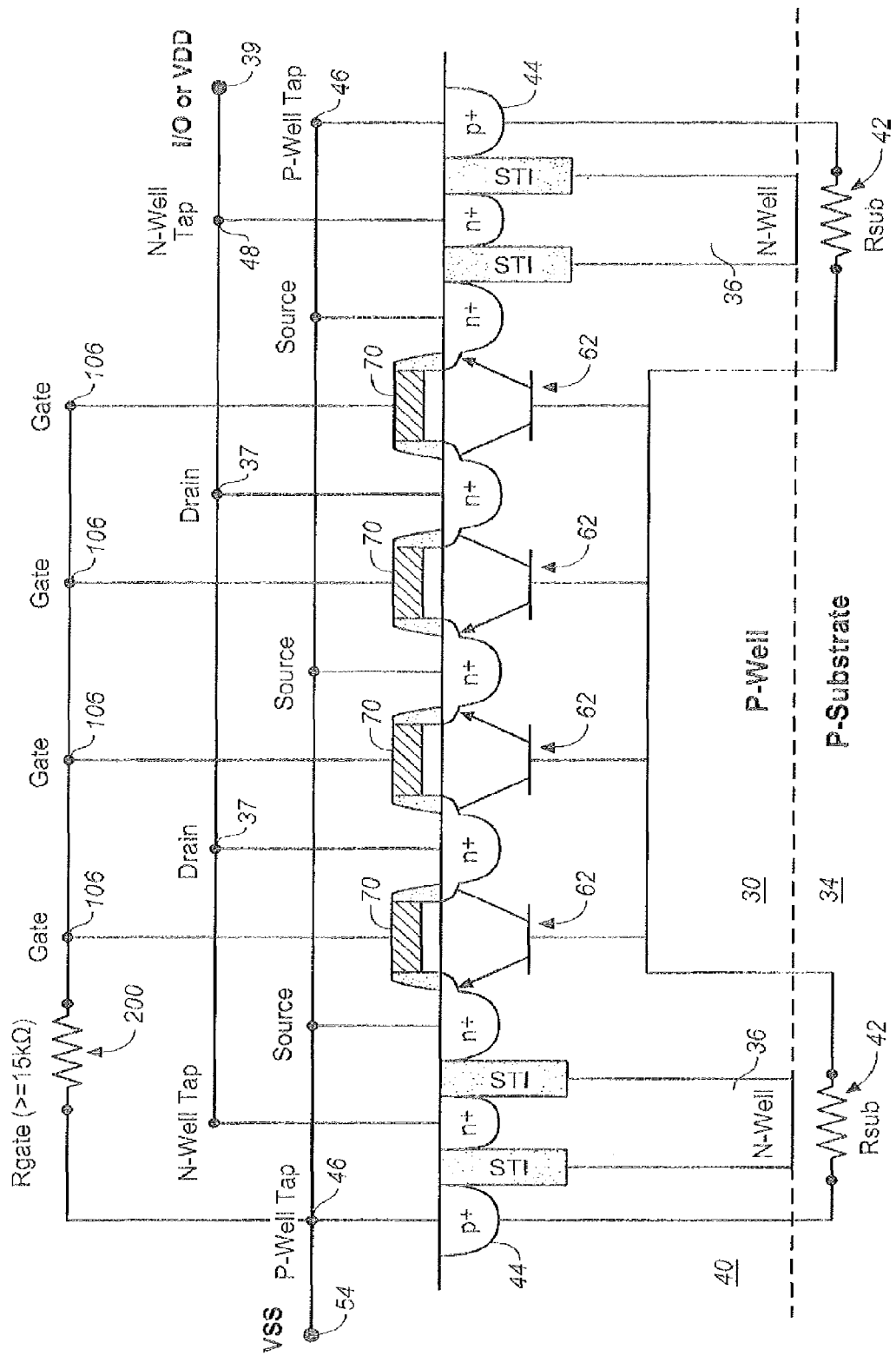
FIG. 11 provides a side, cross-sectional view of another embodiment of the present invention.

C. Duvvury, ESD in Silicon Integrated Circuits, Chapter 4, pp. 55-103]. This gate-coupled device usually needs large layout area, and thus is not feasible. To minimize the layout area, a high-value N-well resistor 200 (preferably having a resistance greater than or equal to 15,000 Ohms) is designed between VSS 54 and gates 106 of NMOS fingers 70 in this inventive design. FIG. 11 shows the cross-sectional diagram for this approach. Since the gate-coupled effect in this inventive design strongly depends on drain-to-gate capacitance of NMOS fingers and the external N-well resistance, the value of the N-well resistor must be well optimized. In deep-submicron CMOS technology, it has been proved that 15 kΩ~20 kΩ typically are the optimized values for 300 µm~500 µm NMOS fingers.

It should be noted that the purpose of the high-value N-well resistor 200 is not to protect gate oxide, but induce the gate voltage due to gate-coupled effect.

In the positive ESD zapping, VDD pad voltage is increased. The gate nodes of NMOS fingers act as a high-pass filter because of drain-to-gate capacitance and the external N-well resistance, and thus will be coupled up. After the gate is coupled, the substrate current of NMOS fingers increases. FIG. 6 shows the normalized DC substrate current in 0.13 µm technology node. Since the inner P-well is separated by the N-well ring, the substrate current will flow into the high resistance P-substrate. Furthermore, because the N-well ring is connected to VDD, it will suppress the substrate current flowing to the P-well taps within the outer P-well due to extension of P-substrate depletion, i.e., increasing the effective substrate resistance. Thus the inner p-well voltage will be built up, and then trigger the parasitic bipolar transistors at lower voltage.

Therefore, the external high-value N-well resistor (≧15 kΩ) plays an important role in the gate-coupled effect. With this gate-coupled effect, the substrate-biased enhancement of NMOS fingers can be improved in the power ESD protection.

Usually the N-well sheet resistance is very high (~1.5 kΩ/square in the 130 nm technology), the layout area for the gate-coupled effect can be easily minimized.

The invention has been studied and proved in Gflx (130 nm) and G90 (90 nm) technologies. Therefore, this substrate-biased enhancement design has been implemented in G90 I/O and Power ESD protection for LSI G90 products, and may be implemented in more advanced technologies.

While embodiments of the present invention are shown and described, it is envisioned that those skilled in the art may devise various modifications of the present invention without departing from the spirit and scope of the appended claims.

What is claimed is:

1. An ESD protection circuit configured to introduce a substrate-biased effect, formed on a P-type semiconductor substrate, for I/O pin protection against both positive and negative ESD stress conditions, comprising:
   a first P-type well formed on the P-type semiconductor substrate, not hard-wired to VSS but shorted to VSS through the P-type semiconductor substrate;
   a second P-type well formed on the P-type semiconductor substrate hard-wired to VSS;
   multi-finger nMOS transistors formed on the first P-type well comprising source regions, hard-wired to VSS, drain regions, hard-wired to an I/O pad, and gate regions, hard-wired to VSS;
   a N-type well ring formed on the P-type semiconductor substrate, hard-wired to the I/O pad, and disposed between the first P-type well and the second P-type well, wherein the first P-type well is isolated from the second P-type well;
   a pMOSFET formed on the P-type semiconductor substrate, comprising a source node, connected to the I/O pad, a drain node, connected to a P-type diffusion ring formed on the first P-type well, and a gate node, connected to VDD;
   wherein the P-type diffusion ring is formed on the first P-type well, hard-wired to a drain node of the pMOSFET, not hard-wired to VSS, but shorted to VSS through the P-type semiconductor substrate.

2. The ESD protection circuit as recited in claim 1, wherein the N-type well ring is hard-wired to the I/O pad and thus suppresses a substrate current flowing to VSS through the second P-type well such that a trigger voltage of the multi-finger nMOS transistors can be lowered in a positive ESD stress event.

3. The ESD protection circuit as recited in claim 2, wherein the trigger voltage of the multi-finger nMOS transistors is lowered such that each of the multi-finger nMOS transistors becomes a non-snapback ESD protection device, wherein the trigger voltage is lower than a holding voltage.

4. The ESD protection circuit as recited in claim 1, wherein the N-type well ring is hard-wired to the I/O pad such that a negative ESD current can flow from the second P-type well to the N-type well, to avoid a negative ESD current flowing from the first P-type well to the second P-type well through the P-type semiconductor substrate.

5. The ESD protection circuit as recited in claim 1, wherein the pMOSFET is turned on in a positive ESD stress condition such that a current is injected from the I/O pad into the first P-type well through the P-type diffusion ring.

6. The ESD protection circuit as recited in claim 5, wherein the P-type diffusion ring is formed on the first P-type well and acts as a trigger node of the multi-finger nMOS transistors, wherein the trigger voltage of the multi-finger nMOS transistors is lowered.

7. The ESD protection circuit as recited in claim 1, wherein the P-type semiconductor substrate has a 2~6 Ohm·cm of resistivity.

8. The ESD protection circuit as recited in claim 1, wherein the multi-finger nMOS transistors are unsilicided.

9. The ESD protection circuit as recited in claim 1, wherein the nMOS transistors have at least 300 um of total width.

10. The ESD protection circuit as recited in claim 1, further comprising a resistor connected to VSS and gates of the nMOS transistors.

11. The ESD protection circuit as recited in claim 10, wherein the resistor has a resistance between 15,000 Ohms and 20,000 Ohms.

* * * * *